(12) United States Patent
Badger et al.

(10) Patent No.: US 6,635,390 B1
(45) Date of Patent: Oct. 21, 2003

(54) METHOD AND SYSTEM FOR REDUCING PARTICULATE CONTAMINATION IN A PELLICLE AIR SPACE

(75) Inventors: Karen D. Badger, Milton, VT (US); James J. Colelli, Jericho, VT (US); Dean C. Humphrey, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 134 days.

(21) Appl. No.: 09/711,037

(22) Filed: Nov. 9, 2000

(51) Int. Cl.[7] .............................. G03F 9/00; B08B 1/02; B08B 6/00
(52) U.S. Cl. ............................. 430/5; 134/1.3; 134/32
(58) Field of Search ............................. 430/5; 428/14; 355/75; 134/1.3, 32

(56) References Cited

U.S. PATENT DOCUMENTS

| | | | |
|---|---|---|---|
| 4,470,508 A | | 9/1984 | Yen |
| 5,332,604 A | * | 7/1994 | Yen ............................ 428/14 |
| 5,766,369 A | | 6/1998 | Tran et al. |
| 5,938,860 A | * | 8/1999 | Williams ..................... 134/34 |

* cited by examiner

*Primary Examiner*—Mark F. Huff
*Assistant Examiner*—Saleha R. Mohamedulla
(74) *Attorney, Agent, or Firm*—Connolly Bove Lodge & Hutz; Richard M. Kotulak

(57) ABSTRACT

A method and system for reducing particulate contamination of a photomask used in lithographic printing. A reticle assembly comprises a pellicle frame and membrane which is adhered to a reticle and encloses an air space over a photomask of the reticle. Particulate matter which can adversely affect a lithographic printing result can be present within the enclosed air space. According to the invention, an interior wall of the pellicle frame is provided with an adhesive surface, and the reticle assembly is subjected to a dislodging motion to dislodge the particulate matter on the photomask surface and cause it to be directed toward the adhesive surface of the interior wall and adhere thereto, removing this particular matter from the focal plane of the lithographic optics.

14 Claims, 2 Drawing Sheets

METHOD AND SYSTEM FOR REDUCING PARTICULATE CONTAMINATION IN A PELLICLE AIR SPACE

BACKGROUND OF THE INVENTION

The present invention relates to a method and system for improving the quality of lithographic printing of integrated circuits on semiconductor wafers, and more particularly to insuring that a reticle used in the lithographic process is free of foreign particles which can adversely affect the printing results.

In lithographic printing, a reticle is a device which embodies a mask, or photomask, defining a design pattern to be transferred by lithographic printing onto a semiconductor wafer. Typically, a reticle is made of a material such as quartz, and may have dimensions, for example, on the order of several inches square by fractions of an inch thick. A film of, for example, chrome may be deposited on the reticle surface and processed to form the mask pattern.

In lithographic printing, the mask is interposed between a radiation source and a semiconductor wafer surface. The radiation passes through the photomask and impinges on an exposure field on the wafer which has been treated with a photosensitive resist material. The photomask pattern is transferred into the resist material, and the wafer is subsequently etched to effect a physical transfer of the mask pattern into the silicon.

Dimensions of the printed mask pattern are typically of a very small order. The size and spacing of some pattern features even approaches, or is less than, the wavelength of the radiation being used to print the pattern. Because of the small dimensions involved in printing the mask pattern, if foreign particulate matter existing in the ambient environment is present on the mask surface, it will interfere with the correct transfer of the mask pattern onto the resist surface.

Accordingly, the lithographic process typically comprises using a thin transparent membrane referred to as a pellicle to shield or seal off the photomask surface from the surrounding environment. The pellicle membrane is offset from the photomask surface, typically by a thin-walled rectangular pellicle frame which is adhered to the reticle. The pellicle membrane and frame create an enclosed air space above the photomask which ideally is free of foreign particles. Particles which subsequently settle on the outer surface of the pellicle membrane do not affect the printing result because they are offset from the focal plane of the lithographic optics.

In view of the importance of keeping the photomask particle-free, great efforts are undertaken to provide an environment for the reticles which is free of contaminants to the extent possible. Nevertheless, in spite of the precautions taken, even after the pellicle frame and pellicle membrane have been adhered to the reticle, foreign particles will be present on the photomask surface within the air space provided by the pellicle frame.

Once the pellicle frame is assembled and adhered to the reticle, an inspection process may be performed in which optical equipment is used to look through the pellicle membrane at the surface of the reticle to detect particles. If particles are detected, the pellicle assembly must be removed, which may damage the reticle and cause additional foreign matter to be introduced.

An existing method of controlling the amount of particulate matter present on the reticle involves coating the interior walls of the pellicle frame with an adhesive substance. Particles which happen to come into contact with the adhesive substance are captured on the sidewalls, reducing the amount of particulate contamination of the photomask surface to a certain extent. However, typically some particles will remain on the photomask even after the pellicle frame is adhered to the reticle, as described above.

In view of the foregoing discussion, a method and system are needed for removing particles from the photomask surface once the pellicle membrane, pellicle frame and reticle have been assembled.

SUMMARY OF THE INVENTION

A method and system according to the present invention provide for the removal of particulate matter from a photomask surface once the pellicle membrane, pellicle frame and reticle have been assembled. According to the invention, a pellicle frame is provided having an adhesive material on an interior wall. The pellicle frame and pellicle membrane are adhered to a reticle to form a finished reticle assembly.

The finished reticle assembly is placed on a device for dislodging any particles or foreign matter which may remain trapped within the pellicle air space over the photomask surface. The dislodging means causes the particulate matter to be dislodged from the photomask surface and move toward the adhesive interior walls of the pellicle frame, and become adhered thereto. The invention thereby permits particulate contamination to be removed from the photomask surface even after a finished reticle, pellicle frame and pellicle membrane have been assembled. Implementation of the invention following reticle assembly and routinely during the life of the reticle would extend reticle and pellicle life and reduce reticle/pellicle rework.

DETAILED DESCRIPTION OF THE INVENTION

Figure 1:
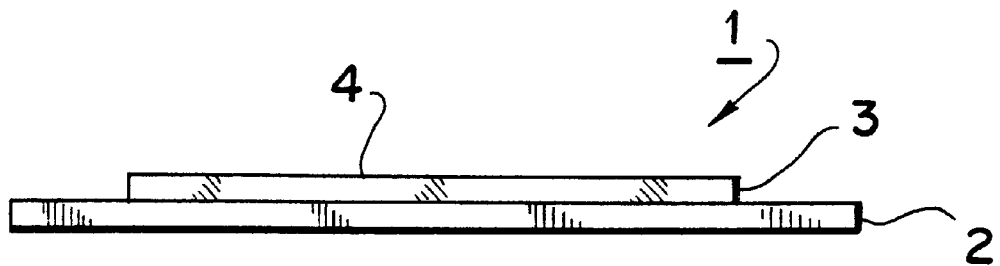
FIG. 1 shows a side elevational view of a reticle assembly, including a reticle, pellicle frame and pellicle membrane.
Figure 2:
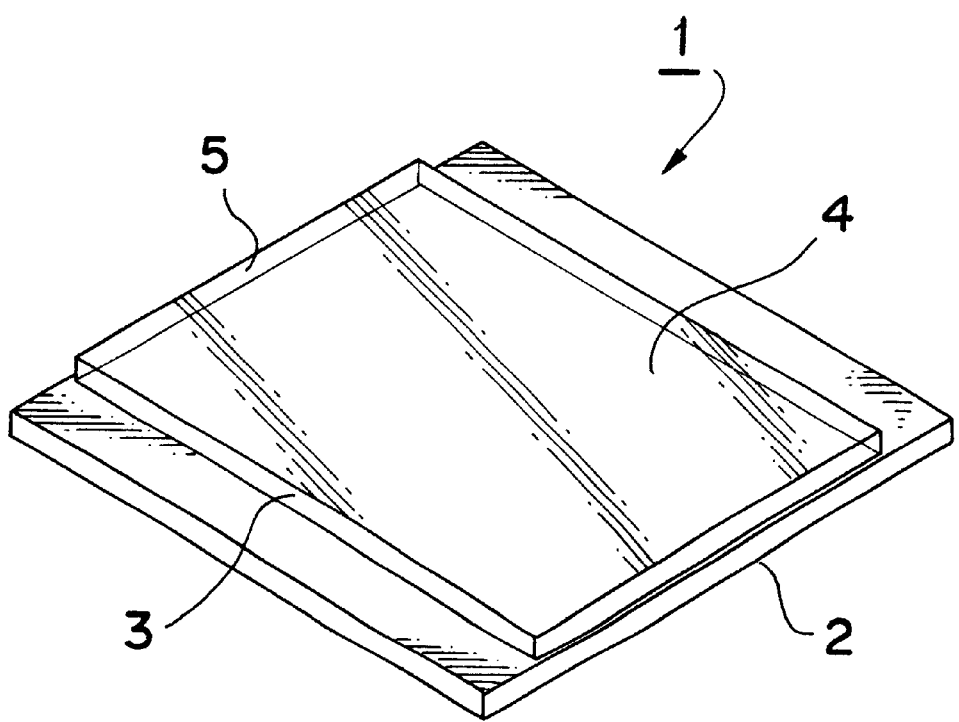
FIG. 2 shows a perspective view of the reticle assembly.

FIGS. 1 and 2 show a side elevational view and a perspective view, respectively, of a finished reticle assembly 1. The reticle assembly comprises a reticle 2, a pellicle frame 3, and a pellicle membrane 4.

The pellicle frame may be embodied as a thin-walled metal frame which is adhered to the surface of the reticle 2 to frame a photomask portion of the reticle.

The pellicle membrane 4 is a substantially transparent material which extends across the photomask and is bonded to an upper edge of the pellicle frame to create a sealed, enclosed air space between the membrane and the reticle surface.

According to the invention, interior walls 5 of the pellicle frame, as shown in FIG. 2, present an adhesive or sticky surface to the interior air space existing between the pellicle membrane and the reticle surface. The sticky surface may be embodied by, for example, a tape having adhesive on both sides, or a film deposited onto the interior sidewalls of the pellicle frame.

Figure 3:
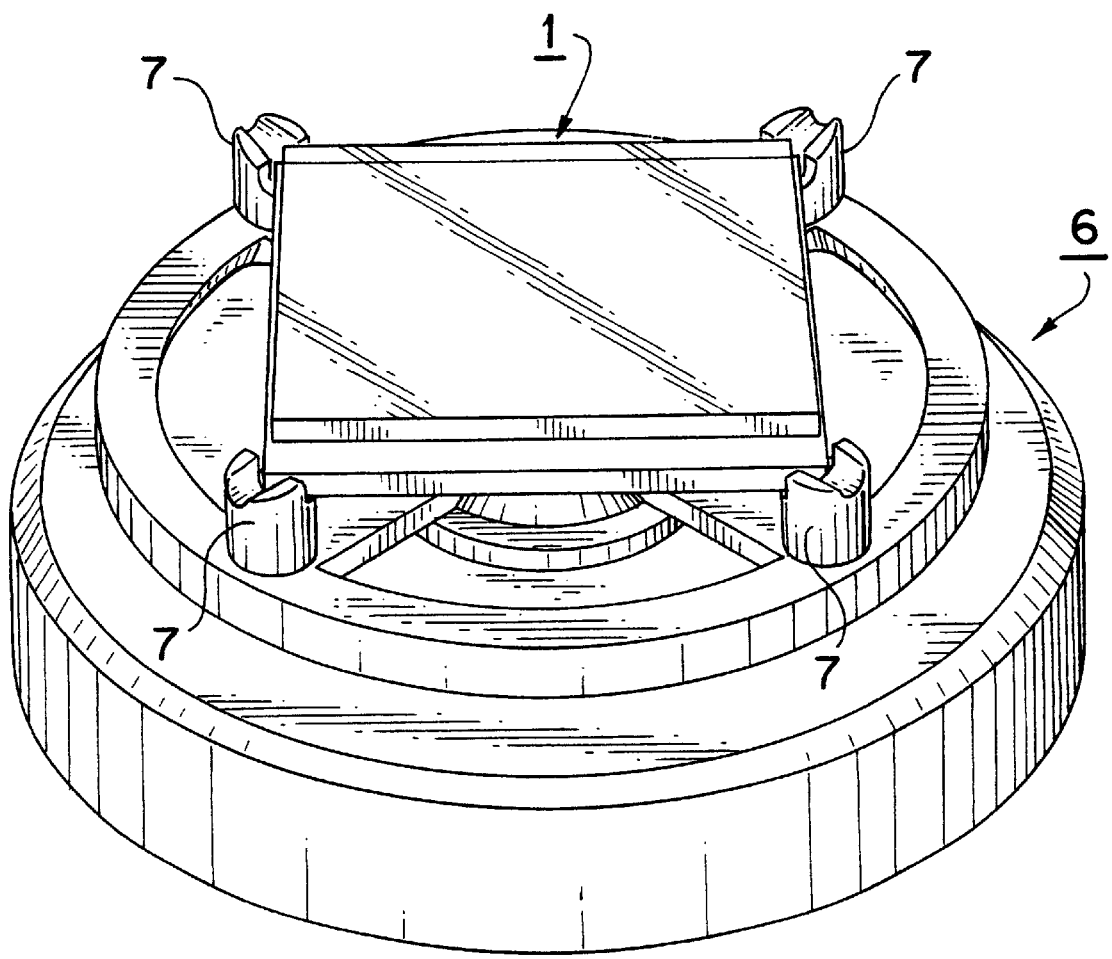
FIG. 3 shows the reticle assembly engaged by dislodging means according to an embodiment of the invention.

FIG. 3 shows the reticle assembly 1 engaged by dislodging means according to the invention. In the embodiment shown in FIG. 3, the dislodging means is a motorized chuck 6 including gripping members 7 which grip the corners of the reticle assembly to hold it securely. The motorized chuck is then activated to spin the reticle assembly for a predetermined period of time. According to data gathered through experimentation, a finished reticle assembly was inspected and particles were detected on the surface of the reticle's photomask. The reticle assembly was then spun on a motorized chuck as shown in FIG. 3 to generate centrifugal force to fling or propel the particles from the surface of the reticle toward the sticky sidewalls of the pellicle frame, and cause them to be collected by adhesion thereto. The reticle surface was subsequently inspected again and the removal of particles from the photomask surface was observed.

Various forms of mechanically-induced perturbation or agitation of the reticle assembly in order to dislodge particles on the photomask surface and propel them toward the adhesive sidewalls of the pellicle frame are contemplated by the invention. For example, a pulsing or jerking movement may be imparted to the reticle assembly to create abrupt lateral or rotational momentum changes to the reticle assembly. The reticle assembly may be subjected to timed sequences of different types of perturbing motion including spinning, pulsing or jerking in different orders. The sequences may be repeated a number of times. The variation of the types of perturbation applied could depend on particle sizes and densities, mask pattern dimensions and densities, and on reticle and pellicle material.

Additionally, the reticle could be heated on the dislodging device to help dislodge the particles during the perturbing motion being applied to the reticle assembly.

According to another alternative, because the chrome constituting the photomask pattern is metallic and therefore conducts electricity, a method could be applied whereby the chrome of the mask and the pellicle frame are charged electrically so as to cause particles on the photomask to be attracted to the pellicle frame. For example, a wire could be used to connect the chrome of the photomask to a ground or negative potential, while another wire connected the pellicle frame to a positive potential; or vice versa. This would tend to cause the particles on the photomask to be attracted toward the sidewalls of the pellicle frame. Such a method would also include the step of mechanically agitating or perturbing the reticle assembly as described above in order to further encourage particles to move toward the sticky sidewall and become adhered thereto.

The foregoing description of the invention illustrates and describes the present invention. Additionally, the disclosure shows and describes only the preferred embodiments of the invention, but it is to be understood that the invention is capable of use in various other combinations, modifications, and environments and is capable of changes or modifications within the scope of the inventive concept as expressed herein, commensurate with the above teachings, and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

What is claimed is:

1. A method of collecting particles in a mask comprising the steps of:

attaching a pellicle frame with an adhesive interior; and perturbing the mask and pellicle frame so that particles release toward the adhesive interior.

2. The method of claim 1, wherein said perturbing step comprises spinning said mask and pellicle frame.

3. The method of claim 1, wherein said perturbing step comprises jerking or pulsing said mask and pellicle frame.

4. The method of claim 1, wherein said perturbing step comprises a combination of spinning, jerking or pulsing said mask and pellicle frame.

5. The method of claim 1, wherein said perturbing step comprises applying opposite electrical charges to said mask and pellicle frame.

6. A method for reducing particulate contamination of a photomask of a reticle, comprising the steps of:

(a) providing a pellicle frame and membrane enclosing an air space above said photomask thereby forming a reticle assembly;

(b) providing an interior wall of said pellicle frame with an adhesive surface; and (c) causing particulate matter enclosed within said air space to be propelled toward said adhesive surface, said step (c) comprising imparting a perturbing motion to said reticle assembly to dislodge particulate matter from said photomask.

7. The method of claim 6, wherein said perturbing motion comprises spinning said reticle assembly to cause centrifugal force to be applied to said particulate matter.

8. The method of claim 6, wherein said perturbing motion comprises jerking or pulsing said reticle assembly.

9. The method of claim 6, wherein said step (c) comprises applying opposite electrical charges to said pellicle frame and said photomask.

10. A method for reducing particulate contamination of a photomask comprising the steps of:

providing an adhesive surface on an interior wall of a pellicle frame, said pellicle frame being adhered to a reticle containing said photomask, a membrane extending across said photomask and secured to an outer edge of said pellicle frame to form a sealed air space enclosing said photomask, said pellicle frame membrane and reticle forming a reticle assembly; and imparting a motion to said reticle assembly to dislodge particles present on said photomask within said air space and cause said particles to be directed toward said adhesive surface on said interior wall.

11. The method of claim 10, wherein said motion comprises spinning.

12. The method of claim 10, wherein said motion comprises jerking or pulsing.

13. The method of claim 10, wherein said motion comprises a combination of spinning, jerking and pulsing.

14. The method of claim 13, wherein said pulsing, jerking and spinning motions are repeated in alternating sequences.

* * * * *